(12) United States Patent
Kim et al.

(10) Patent No.: US 7,602,072 B2
(45) Date of Patent: Oct. 13, 2009

(54) SUBSTRATE HAVING ALIGNMENT MARKS AND METHOD OF OBTAINING ALIGNMENT INFORMATION USING THE SAME

(75) Inventors: Joon-Sung Kim, Gyeonggi-do (KR); Ji-Yong You, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 298 days.

(21) Appl. No.: 11/723,362

(22) Filed: Mar. 19, 2007

(65) Prior Publication Data
US 2007/0296935 A1 Dec. 27, 2007

(30) Foreign Application Priority Data
Jun. 23, 2006 (KR) .................. 10-2006-0057058

(51) Int. Cl.
*H01L 21/76* (2006.01)
(52) U.S. Cl. .................. 257/797; 438/401; 438/462; 257/E23.179
(58) Field of Classification Search .................. None
See application file for complete search history.

(56) References Cited

U.S. PATENT DOCUMENTS

| | | | | |
|---|---|---|---|---|
| 6,172,409 B1 * | 1/2001 | Zhou | ............... | 257/620 |
| 6,218,200 B1 * | 4/2001 | Chen et al. | ............... | 438/14 |
| 6,801,313 B1 * | 10/2004 | Yokota | ............... | 356/401 |
| 7,180,593 B2 * | 2/2007 | Lin | ............... | 356/401 |
| 7,190,823 B2 * | 3/2007 | Chen | ............... | 382/151 |
| 7,190,824 B2 * | 3/2007 | Chen | ............... | 382/151 |
| 7,323,393 B2 * | 1/2008 | Yen et al. | ............... | 438/401 |
| 7,449,792 B2 * | 11/2008 | Yang et al. | ............... | 257/797 |
| 2001/0033976 A1 * | 10/2001 | Soenosawa | ............... | 430/5 |
| 2003/0053059 A1 * | 3/2003 | Mishima et al. | ............... | 356/401 |
| 2003/0054574 A1 * | 3/2003 | Tanaka et al. | ............... | 438/4 |
| 2003/0174879 A1 * | 9/2003 | Chen | ............... | 382/151 |

FOREIGN PATENT DOCUMENTS

| KR | 1020020002926 A | 1/2002 |
|---|---|---|
| KR | 1020020009880 | 2/2002 |
| KR | 0545204 | 1/2006 |

* cited by examiner

*Primary Examiner*—Alonzo Chambliss
(74) *Attorney, Agent, or Firm*—Volentine & Whitt, PLLC

(57) ABSTRACT

The alignment marks formed in a scribe line of a semiconductor substrate include at least one main mark, a first sub-mark and second sub-marks. The first sub-mark is formed at a central portion of the main mark. The second sub-marks are disposed symmetrically with respect to the first sub-mark and are used for detecting asymmetry of the main mark by measuring distances between respective side edges of the main mark and the first sub-mark, and by measuring respective side edges between the main mark and each of the second sub-marks. Alternatively, the alignment marks include main outer and inner marks and a sub-mark disposed in between the main outer and inner marks. In this case, the sub-mark is used for detecting asymmetry of the main mark by measuring distances between respective side edges of the main outer mark and the sub-mark, and by measuring respective side edges between the main inner mark and the sub-mark. Thus, accurate alignment information can be obtained regardless of whether the main mark was inadvertently formed as asymmetrical.

13 Claims, 6 Drawing Sheets

FIG. 8

SUBSTRATE HAVING ALIGNMENT MARKS AND METHOD OF OBTAINING ALIGNMENT INFORMATION USING THE SAME

BACKGROUND OF THE INVENTION

1. Field of the Invention

The present invention relates to the forming of superimposed patterns on a substrate in the manufacturing of semiconductor devices and the like. More particularly, the present invention relates to a substrate inscribed with alignment marks for ensuring that an upper pattern is formed in alignment with a lower pattern on the substrate. The present invention also relates to a method of forming such alignment marks and to a method of obtaining alignment information for use in superimposing patterns on a substrate, in the manufacturing of a semiconductor device.

2. Description of the Related Art

In general, a semiconductor device is manufactured by forming patterns on a semiconductor substrate. Each pattern is formed through a series of processes. The processes are performed selectively and repeatedly to form the patterns one above the other on the substrate. In this respect, it is very important for a lower pattern (formed by a first series of processes) and an upper pattern (formed by a subsequent series of processes) to be aligned with each other. To this end, alignment marks are used. The alignment marks are formed on a scribe line of the semiconductor substrate which demarcates regions (dies) in which circuit structures are formed Referring to FIGS. 1 and 2, conventional alignment marks 10 include a main alignment mark 11 in the form of a rectangular band, and a sub-alignment mark 12 disposed at a central region of the main alignment mark 11. The main alignment mark 11 is part of a conductive pattern. The sub-alignment mark 12 is part of a photoresist pattern.

Figure 1:
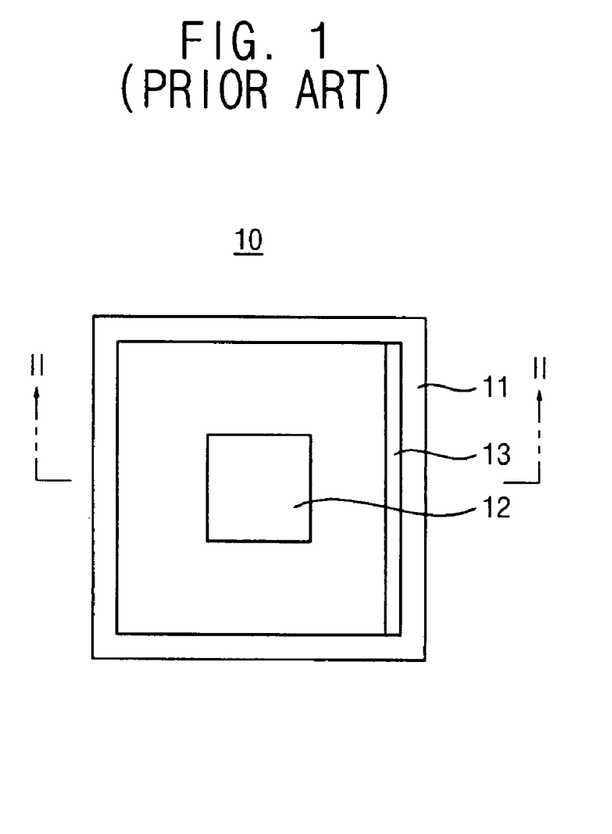
FIG. 1 is a plan view of a conventional alignment inscription.
Figure 2:
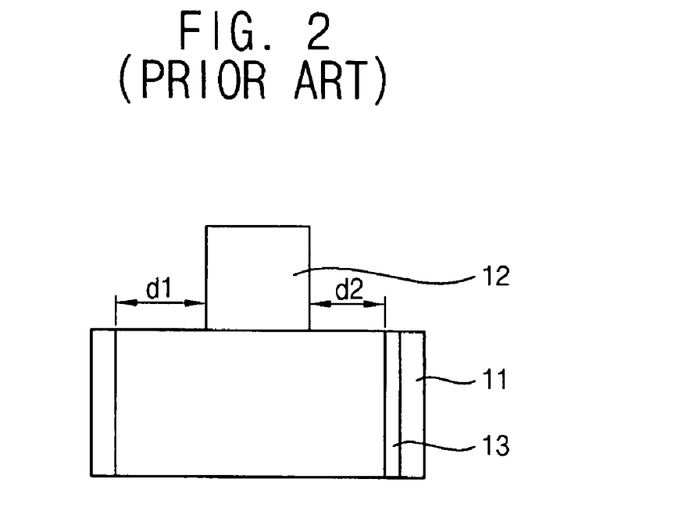
FIG. 2 is a cross-sectional view taken along a line II-II' in FIG. 1.

That is, the main alignment mark 11 is formed by a sputtering process in a first series of processes aimed at forming a lower conductive pattern on the semiconductor substrate. The sub-alignment mark 12 is formed by a photolithographic process in a subsequent series of processes aimed at forming an upper pattern on the semiconductor substrate. Distances between the main alignment mark 11 and the sub-alignment mark 12 are measured in lengthwise and widthwise directions of the scribe line. The degree to which the upper pattern and the lower pattern are aligned is determined based on these overlay measurements. Moreover, the overlay measurements are fed back to the processing equipment for use in adjusting the equipment, if necessary, to ensure that subsequently formed patterns are accurately aligned with the previously formed patterns.

However, as shown in FIGS. 1 and 2, the sputtering process may form a protrusion 13 at an inner side of the main alignment mark 11. In this case, a first distance d1 between one inner side of the main alignment mark 11 and an adjacent outer side of the sub-alignment mark 12 is different from a second distance d2 between the other inner side of the main alignment mark 11 and the adjacent outer side of the sub-alignment mark 12. That is, results of the overlay measurements (alignment information) will indicate a difference between the first distance d1 and the second distance d2 even though the sub-alignment mark 12 was centered relative to the main alignment mark 11. Therefore, the results of the overlay measurements will incorrectly indicate that the sub-alignment mark 12 was formed as offset relative to the main alignment mark 11, i.e., that the upper pattern and the lower pattern are misaligned. As a result, the data fed back to the processing equipment as a result of the overlay measurement process will cause the equipment to form a subsequent pattern out of alignment.

SUMMARY OF THE INVENTION

A feature of the present invention is to provide alignment marks by which accurate alignment information may be obtained in the manufacturing of semiconductor devices and the like.

Another feature of the present invention is to provide a method of obtaining alignment information which accurately represents the degree to which superimposed patterns are aligned in the manufacturing of semiconductor devices and the like.

According to one aspect of the present invention, alignment marks of a substrate, formed in a scribe line of the substrate, include at least one main mark, a first sub-mark and second sub-marks. The first sub-mark is centrally located with respect to inner side edges of the main mark. The second sub-marks are disposed symmetrically with respect to the first sub-mark. The alignment marks are formed as part of the processes that form upper and lower patterns on a region (die) of the substrate.

According to another aspect of the present invention, there is provided a method of obtaining alignment information using the alignment marks. In addition to steps of forming the alignment marks, the method includes determining a degree of alignment between the at least one main mark and the first sub-mark, determining a degree of alignment between the at least one main mark and one of the second sub-marks, and determining a degree of alignment between the at least one main mark and the other of the second sub-marks. Values corresponding to the degree of alignment between the at least one main mark and the first sub-mark, the degree of alignment between the at least one main mark and the one second sub-mark, and the degree of alignment between the at least one main mark and the other second sub-mark are assigned to thereby provide first, second and third values, respectively. The average of the second and third values is subtracted from the first value to yield a final alignment value representative of the degree of alignment between upper and lower patterns formed on the substrate.

The main mark may have a first inner side edge, a second inner side edge, a first outer side edge, and a second outer side edge facing in opposite directions at opposite sides of the first and the second inner side edges, respectively. In this case, each of the second sub-marks has inner side edges located on opposite sides of a respective pair of the inner and outer side edges of the main mark, respectively.

In this case, the degree of alignment between the main mark and the first sub-mark is determined by measuring the distance between the first inner side edge of the main mark and the first outer side edge of the first sub-mark, measuring the distance between the second inner side edge of the main mark and the second outer side edge of the first sub-mark, and dividing the difference between the distances by two. Likewise, the degree of alignment between the main mark and each of the second sub-marks is determined by measuring the distance between a respective one of the inner side edges of the main mark and a first one of the inner side edges of the second sub-mark, measuring the distance between the second inner side edge of the main mark and a second one of the inner side edges of the second sub-mark, and dividing the difference between the distances by two.

Alternatively, and according to another aspect of the invention, the at least one main mark includes a central main mark and peripheral main marks. The central main mark has inner side edges facing each other and in between which the first sub-mark is situated. The peripheral main marks are disposed to both sides of the central mark, respectively. Each of the peripheral main marks has inner side edges facing each other in the same direction as the inner side edges of the central mark, and each of the second sub-marks is situated in between the inner side edges of a respective one of the peripheral marks. For example, the peripheral main marks have corners that are disposed diagonally across from each other. In this case, the sub-marks are disposed adjacent the corners of the peripheral main marks, respectively.

In this case, the degree of alignment between the at least one main mark and the first sub-mark is determined by measuring the distance between the first inner side edge of the central main mark and the first outer side edge of the first sub-mark, measuring the distance between the second inner side edge of the central main mark and the second outer side edge of the first sub-mark, and dividing the difference between the distances by two. The degree of alignment between the at least one main mark and each of the second sub-marks is determined by measuring the distance between one inner side edge of a respective one of the peripheral main marks and one outer side edge of the second sub-mark associated with the peripheral main mark, measuring the distance between the other inner side edge of the respective one of the peripheral main marks and the other outer side edge of the second sub-mark, and dividing the difference between the distances by two.

According to still another aspect of the present invention, alignment marks, formed in a scribe line of a substrate, include a main outer mark, a main inner mark and a sub-mark. The main outer mark has a first inner side edge and a second inner side edge faced towards each other. The main inner mark is disposed at the same level as the main mark and is situated in between the inner side edges of the main outer mark. Thus, the main inner mark has a first outer side edge and a second outer side edge faced towards the first and the second inner side edges of the main outer mark, respectively. The sub-mark is disposed on the substrate at a level different from those at which the main inner and outer marks are disposed, and is situated intermediate the main outer and inner marks. The sub-mark has outer side edges faced in directions towards the inner side edges of the main outer mark, respectively, and inner side edges faced in directions towards the outer side edges of the main inner mark, respectively.

According to another aspect of the present invention, there is provided a method of obtaining alignment information using these alignment marks. In addition to steps of forming the alignment marks, the method includes determining a degree of alignment between the main outer mark and the sub-mark, and determining a degree of alignment between the main inner mark and the sub-mark. Values corresponding to the degree of alignment between the main outer mark and the sub-mark, and the degree of alignment between the main inner mark and the sub-mark are assigned to thereby provide first and second values, respectively. The first and second values are averaged to yield a final alignment value representative of the degree of alignment between upper and lower patterns formed on the substrate.

For example, the degree of alignment between the main outer mark and the sub-mark is determined by measuring the distance between the first inner side edge of the main outer mark and the first outer side edge of the sub-mark, measuring the distance between the second inner side edge of the main outer mark and the second outer side edge of the sub-mark, and dividing the difference between the distances by two. Likewise, the degree of alignment between the main inner mark and the sub-mark is determined by measuring the distance between the first outer side edge of the main inner mark and the first inner side edge of the sub-mark, measuring the distance between the second outer side edge of the main inner mark and the second inner side edge of the sub-mark, and dividing the difference between the distances by two. According to the present invention, accurate alignment information, which reflects a protrusion inadvertently produced by the series of processes used to form the lower pattern and the main alignment mark, may be obtained. That is, the present invention compensates for any asymmetry in the main alignment mark(s). Thus, the degree of alignment between an upper pattern and a lower pattern formed on the substrate may be precisely determined using the alignment information.

BRIEF DESCRIPTION OF THE DRAWINGS

The above and other objects, features and advantages of the invention will become readily apparent by referring to the following detailed description of the preferred embodiments thereof made in conjunction with the accompanying drawings wherein.

DETAILED DESCRIPTION OF THE EMBODIMENTS

The present invention will described more fully hereinafter with reference to the accompanying drawings. In the drawings, the size and relative sizes of layers and regions may be exaggerated for the sake of clarity. Also, like reference numerals designate like elements throughout the drawings. Also, certain element(s)/layer(s) may be omitted for the sake of clarity. That is, the specification may refer to an element/layer as being disposed "on" another element/layer. In this case, the description means that the referenced element/layer may be disposed directly on the other element/layer or that an intervening element(s) or layer(s) may be present between the referenced element/layer and the other element/layer. Still further, the specification uses the relative terms "right", "left", "up" and "down" in connection with certain features of the present invention. However, it will be understood that these terms are not limiting in any respect but are merely used in connection with identifying the relative locations at which such features of the present invention are shown the drawings. Likewise, the terms "first", "second", etc. are used in the specification only as a means to differentiate similar features or steps from one another and do not necessarily identify any particular order associated with the forming of such features or any particular order in which such steps are carried out.

Figure 3:
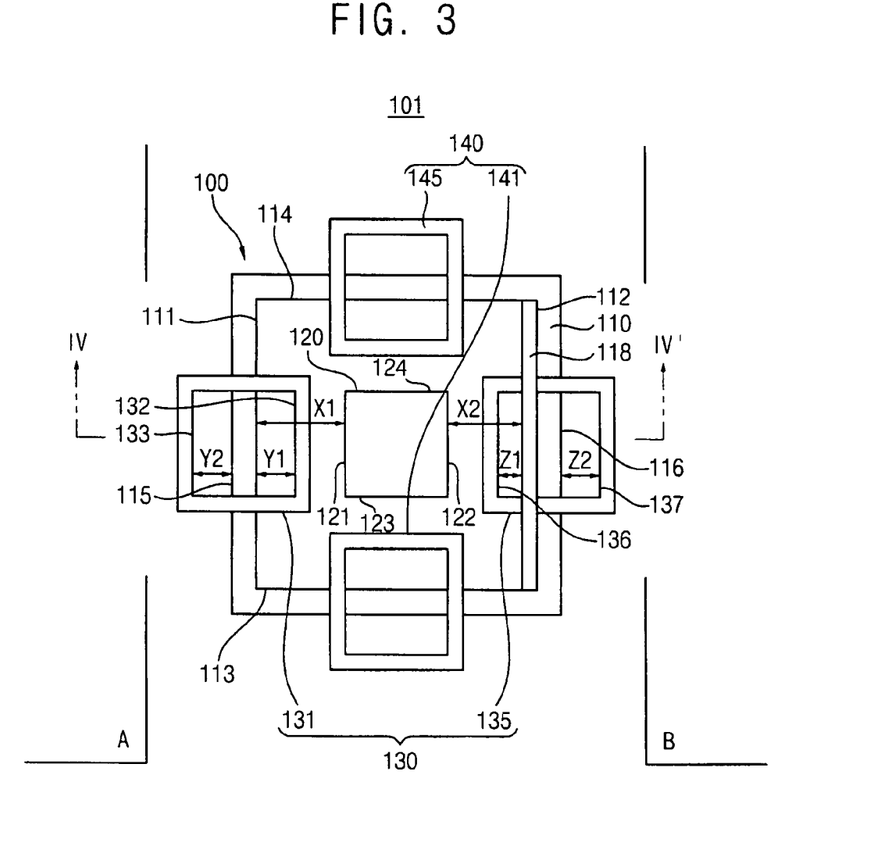
FIG. 3 is a plan view of a section of a substrate having an example embodiment of an alignment inscription in accordance with the present invention.
Figure 4:
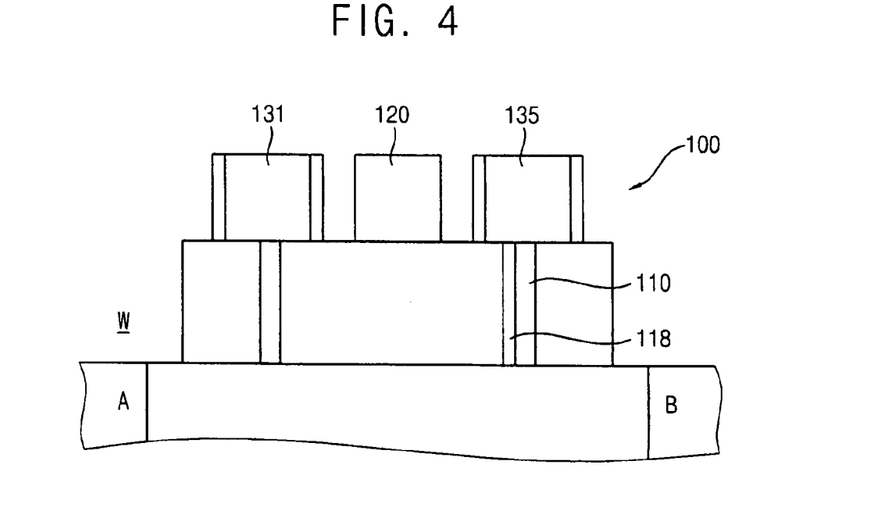
FIG. 4 is a cross-sectional view taken along a line IV-IV' in FIG. 3.

Referring to FIGS. 3 and 4, a semiconductor substrate W has alignment marks 100 confined to a scribe line 101. The scribe line 101 demarcates regions A, B (dies) of the substrate W in which circuit structures are formed. The alignment marks 100 include a main mark 110, a first sub-mark 120 and second sub-marks 130.

For example, the main mark 110 is a band in the form of a rectangle. Thus, the main mark 110 has a first inner side edge 111, a second inner side edge 112 opposite and extending parallel to the first inner side edge 111, a third inner side edge 113 substantially perpendicular to the first and second inner side edges 111 and 112, and a fourth inner side edge 114 opposite and extending parallel to the third inner side edge 113. The main mark 110 may be formed simultaneously with a lower pattern formed on a die A, B of the semiconductor substrate W. More specifically, the main mark 110 may be part of a conductive (metal) pattern that is formed by subjecting the substrate W to a first series of processes including a sputtering process. Such a sputtering process, though, may form a protrusion 118 as an integral part of the main mark 110 and at only one inner side of the main mark 110. In this case, for example, the distance between the center of the main mark 110 and the first inner side edge 111 is different from the distance between the center of the main mark 110 and the second inner side edge 112.

The first sub-mark 120 is formed on a region of the substrate W corresponding to a central portion of the main mark 110. That is, the center of the first sub-mark 120 is substantially coincident with a line passing directly above the intended center of the main mark 110. The first sub-mark 120 may be formed simultaneously with an upper pattern that is formed over the lower pattern. More specifically, the first sub-mark 120 may be part of a photoresist pattern that is formed by subjecting the substrate W to a second series of processes including a photolithographic process. For example, the first sub-mark 120 is rectangular, i.e., is a solid rectangle of photoresist. Thus, the first sub-mark 120 has a first outer side edge 121 facing the first inner side edge 111 of the main mark 110, a second outer side edge 122 facing the second inner side edge 112 of the main mark 110, a third outer side edge 123 facing the third inner side edge 113 of the main mark 110, and a fourth outer side edge 124 facing the fourth inner side edge 114 of the main mark 110.

The second sub-marks 130 include a left mark 131 formed on a first side of the main mark 110, and a right mark 135 formed on a second side of the main mark 110 opposite the first side. For example, the left mark 131 and the right mark 135 have substantially the same shape and more preferably, both have the form of a square band. Moreover, the left mark 131 and the right mark 135 are symmetrical with respect to the first sub-mark 120. Thus, in an example embodiment, the centers of the left mark 131 and the right mark 135 both lie along a line that passes through the center of the main mark 110.

Also, the left mark 131 has a first inner side edge 132 facing the first inner side edge 111 of the main mark 110, and a second inner side edge 133 facing a first outer side edge 115 of the main mark 110 opposite to the first inner side edge 111 of the main mark 110. Furthermore, the right mark 135 has a first inner side edge 136 facing the second inner side edge 112 of the main mark 110, and a second inner side edge 137 facing a second outer side edge 116 of the main mark 110 opposite to the second inner side edge 112 of the main mark 110.

As will be described below, the degree of alignment between the upper pattern and the lower pattern is determined based on measurements of the alignment marks 100 taken in two orthogonal directions, namely in both the widthwise direction of the scribe line 101 and in the lengthwise direction of the scribe line 101. In the embodiment shown in FIG. 3, the protrusion 118, if formed, influences these measurements in the widthwise direction of the scribe line 101. Therefore, the alignment marks 100 may also include third sub-marks 140 corresponding to the second sub-marks 130. Specifically, the third sub-marks 140 include a lower mark 141 formed on a third side of the main mark 110 and an upper mark 145 formed on a fourth side of the main mark opposite the third side. The dispositions of the third sub-marks 140 relative to the outer side edges 123 and 124 of the second sub-mark 120 are substantially the same as the dispositions of the second sub-marks 130 with respect to the outer side edges 121 and 122 of the second sub-mark 120. Therefore, the third sub-marks 140 will not be described any further for the sake of brevity.

Figure 5:
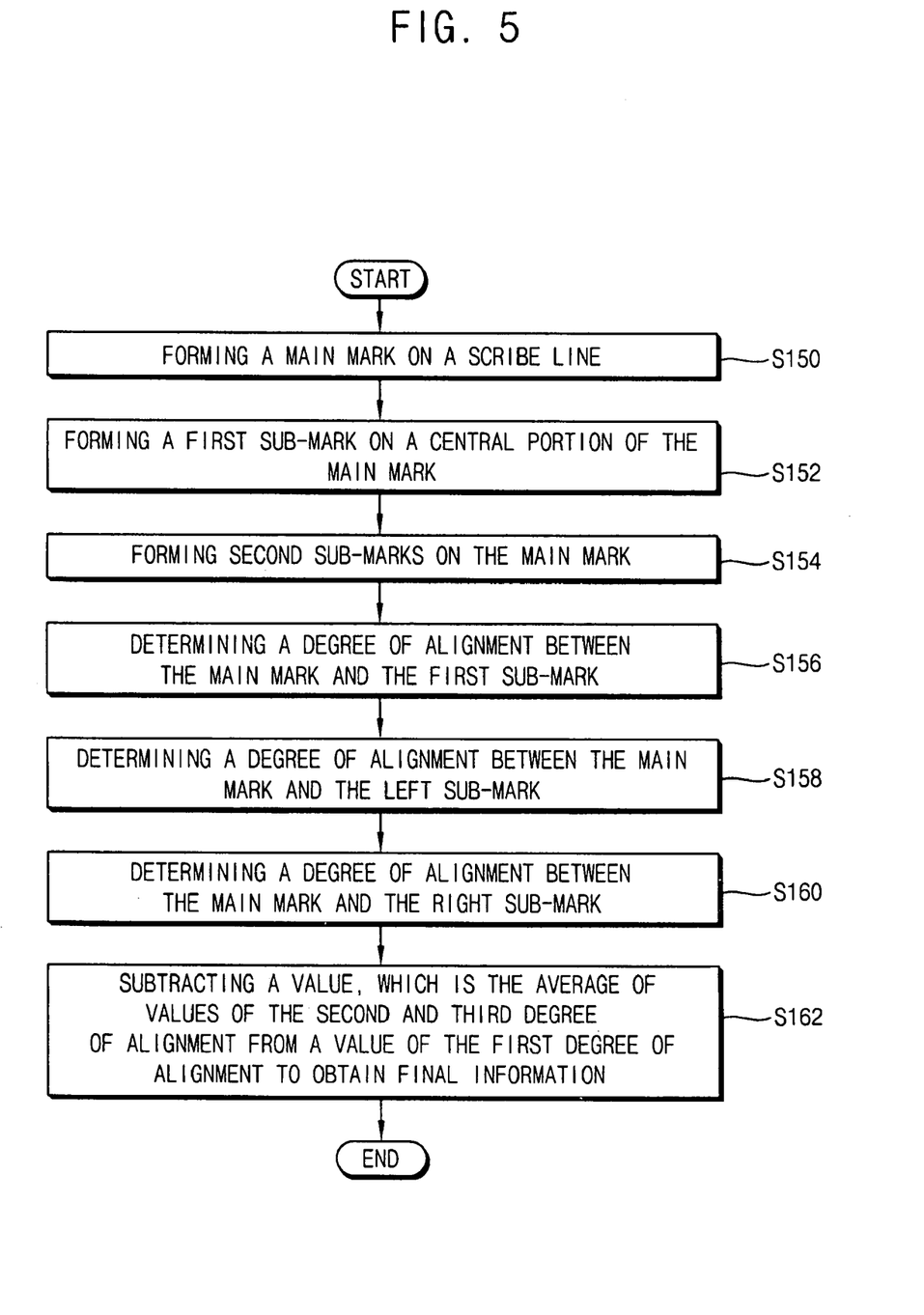
FIG. 5 is a flow chart of a method of obtaining alignment information using the alignment inscription of FIG. 3.

FIG. 5 is a flow chart of a method for determining a degree of alignment between an upper pattern and a lower pattern, using the alignment marks 100, according to the present invention.

Referring to FIGS. 3 to 5, the main mark 110 is formed on the semiconductor substrate W in the scribe line 101 by a series of first processes including a sputtering process (S150). The first series of processes also forms a lower pattern (not shown) on the substrate W within a die A, B of the substrate. The main mark 110 is intended to have a uniform width. In an example embodiment, however, the sputtering process forms an unintended protrusion 118 extending inwardly at one side of the main mark 110. The protrusion 118 has a width of about 10 nm.

Next, the first sub-mark 120 is formed on a central portion of the main mark 110 by a second series of processes including processes that form a photoresist pattern (S152). In this respect, the first sub-mark 120 is part of the photoresist pattern. The second series of processes is also for forming an upper pattern on the substrate W within a die A, B of the substrate. Also, the second sub-marks 130 are formed on the main mark 110 (S154). More specifically, the left mark 131 is formed on the first side of the main mark 110, and the right mark 135 is formed on the second side of the main mark 110. A degree of alignment between the main mark 110 and the first sub-mark 120 is determined (S156) once the second sub-marks 130 have been formed. This degree of alignment will be designated as the first degree of alignment. Specifically, a first distance X1 between the first inner side edge 111 of the main mark 110 and the first outer side edge 121 of the first sub-mark 120 is measured. Also, a second distance X2 between the second inner side edge 112 of the main mark 110 and the second outer side edge 122 of the first sub-mark 120 is measured. In the example shown in FIG. 3, the second distance X2 is less than the first distance X1 by the width of the protrusion 118, i.e., about 10 nm. The difference between the first distance X1 and the second distance X2 is divided by two, and the first degree alignment is assigned this value. Accordingly, for example, the first degree of alignment is about 5 nm.

A degree of alignment between the main mark 110 and the left mark 130 is also determined (S158).This degree of alignment will be designated as the second degree of alignment. Specifically, a first distance Y1 between the first inner side edge 111 of the main mark 110 and the first inner side edge 132 of the left mark 131 is measured. Also, a second distance Y2 between the first outer side edge 115 of the main mark 110 and the second inner side edge 133 of the left mark 131 is measured. The difference between the first distance Y1 and the second distance Y2 is divided by two to obtain the degree of alignment between the main mark 110 and the left mark 131. For example, the difference between the first distance Y1 and the second distance Y2 is about 0 because the sputtering process did not produce any protrusion at the first side of the main mark 110. Therefore, the second degree of alignment is assigned a value about 0.

A degree of alignment between the main mark 110 and the right mark 135 is also determined (S160). This degree of alignment will be designated as the third degree of alignment. Specifically, a first distance Z1 between the second inner side edge 112 of the main mark 110 and the first inner side edge 136 of the right mark 135 is measured. Furthermore, a second distance Z2 between the second outer side edge 116 of the main mark 110 and the second inner side edge 137 of the right mark 135 is measured. The difference between the first distance Z1 and the second distance Z2 is divided by two, and the degree of alignment between the main mark 110 and the right mark 135 is assigned the resulting value. For example, the difference between the first distance Z1 and the second distance Z2 is about 10 nm. Therefore, the third degree of alignment is assigned a value of about 5 nm.

A final degree of alignment is then calculated (S162). This final degree of alignment represents an actual degree of alignment between the main mark 110 and the first sub-mark 120. First, the difference between the second degree of alignment and the third degree of alignment is divided by two. The result is subtracted from the first degree of alignment to obtain the final degree of alignment. For example, the first degree of alignment is about 5 nm and the average of the second and third degrees of alignment is about 2.5 nm. Therefore, the final degree of alignment is about 2.5 nm.

Note, the final degree of alignment calculated according to the present invention factors in the protrusion 118, but not any misalignment of the first sub-mark 120 relative to the main mark 110. Also, degrees of alignment between the fourth sub-marks 140 and the main mark 110 can be determined, respectively, in a manner similar to that used to determine the third degree of alignment. The results may be used to verify the final degree of alignment. Finally, the final degree of alignment is converted to a compensation value corresponding to the width of the protrusion 118. The compensation value is fed back to an alignment measuring device for determining the degree of alignment between the upper and lower patterns formed on the die A, B of the substrate W. The results produced by the measuring device are adjusted by the compensation value. Therefore, the results produced by the alignment measuring device will indicate that the upper and lower patterns are aligned (normal) even when the alignment marks 100, scrutinized by the alignment measuring device, include a main mark 110 that has not been formed properly, i.e., is asymmetrical.

Figure 6:
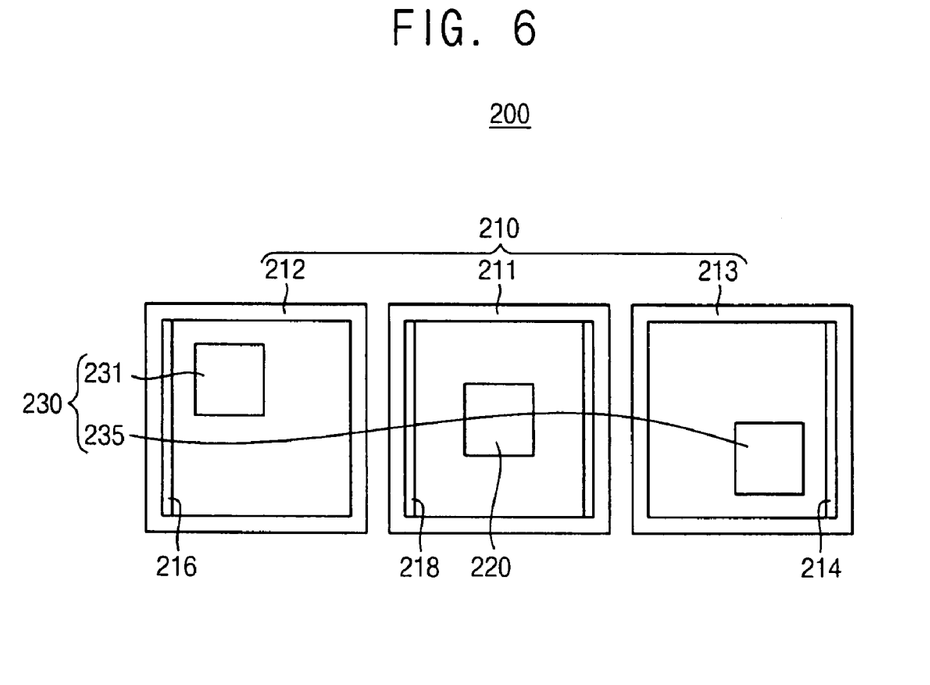
FIG. 6 is a plan view of an example embodiment of an alignment inscription in accordance with the present invention.

FIG. 6 shows another example embodiment of a substrate having alignment marks 200 according to the present invention. Those aspects of this example embodiment which are the same as those described above in connection with first embodiment, e.g., the forming of the alignment marks 200, will not be described for the sake of brevity.

Referring now to FIG. 6, the alignment marks 200 are formed on a scribe line of a semiconductor substrate which scribe line demarcates the dies of the substrate (refer to FIGS. 3 and 4). The alignment marks 200 include main mark 210, a first sub-mark 220 and second sub-marks 230. The main marks 210, in turn, include a central main mark 211, a left (peripheral) main mark 212 disposed to and adjacent one side of the central main mark 211, and a right (peripheral) main mark 213 disposed to and adjacent the other side of the central mark 211. The central main mark 211, the left main mark 212 and the right main mark 213 have substantially the same shape, e.g., are all in the form of a rectangular band. The sputtering process used to form the main marks (and a lower pattern on a die of the substrate) also inadvertently forms protrusions 218 at inner sides of the central main mark 210 facing one another. Characteristically, the sputtering process will also form protrusions 216 and 214 at a left inner side of the left main mark 212 and at a right inner side of the right main mark 214, respectively. The first sub-mark 220 is formed on a central portion of the central mark 211. For example, the first sub-mark 220 is part of a photoresist pattern and has a solid square shape.

The second sub-marks 230 include a left sub-mark 231 and a right sub-mark 235. The left sub-mark 231 and the right sub-mark 235 have substantially the same size and shape. The left sub-mark 231 is disposed on the interior region of the left main mark 212, i.e., on the region bounded by the left main mark 212. Specifically, the left sub-mark 231 is located over the interior region of the left main mark 212 at an upper left corner of the left main mark 212. The right sub-mark 235 is disposed on the interior region of the right main mark 213. Specifically, the right sub-mark 235 is located on the interior region of the right main mark 213 at a lower right corner of the right main mark 213. Thus, the left sub-mark 231 and the right sub-mark 235 are located on a diagonal line that extends from the upper left corner of the left main mark 212 to the lower right corner of the right main mark 213 through the center of the central main mark 211. In particular, the left sub-mark 231 and the right sub-mark 235 are arranged symmetrically with respect to the first sub-mark 220.

Figure 7:
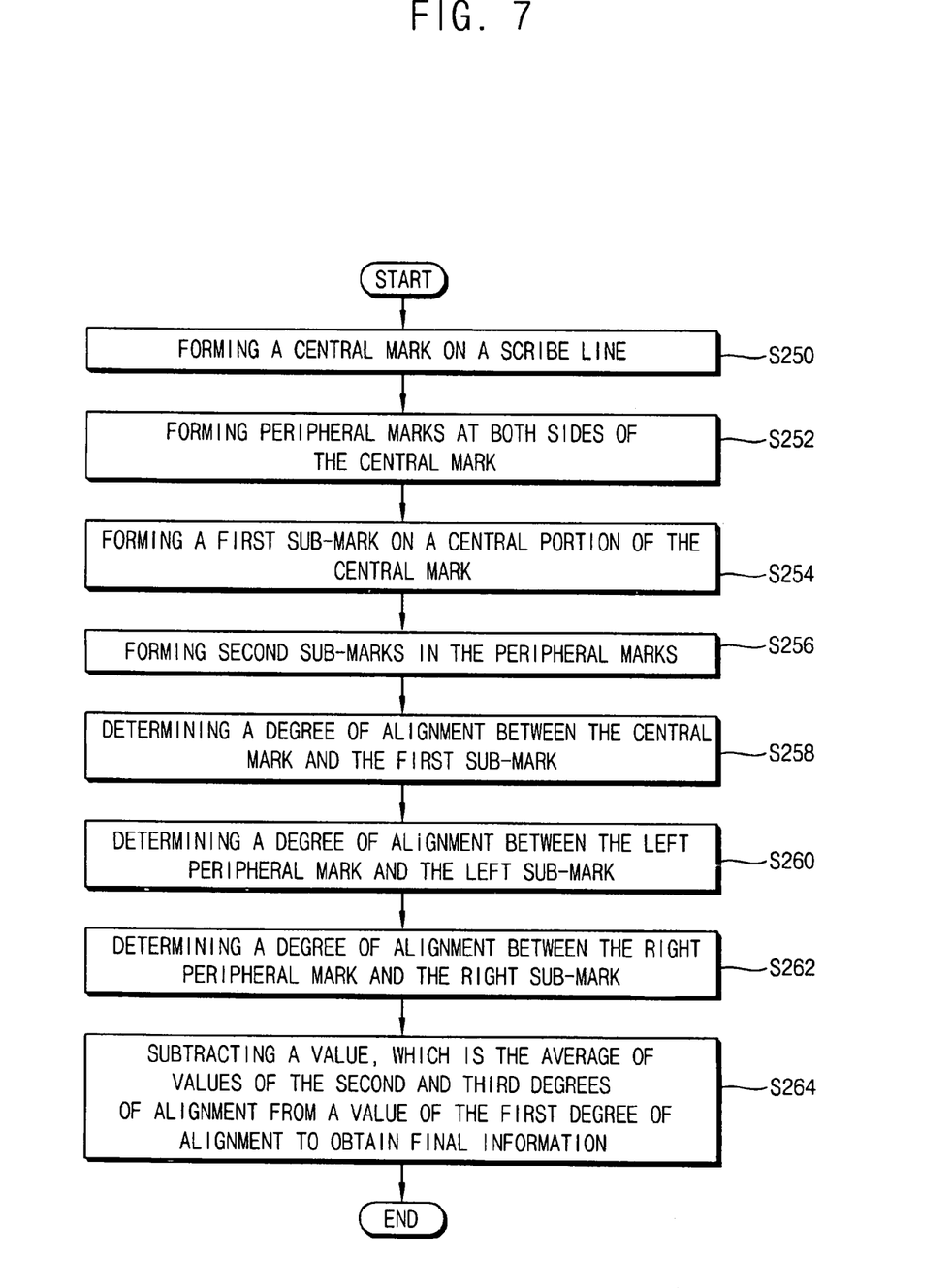
FIG. 7 is a flow chart of a method of obtaining alignment information using the alignment inscription of FIG. 6.

FIG. 7 is a flow chart of a method for determining a degree of alignment between an upper pattern and a lower pattern, using the alignment marks 200, according to the present invention.

Referring to FIGS. 6 and 7, the central main mark 211 is formed on a scribe line of a semiconductor substrate by a sputtering process (S250). At this time, the protrusions 218 may be formed at the inner opposite sides of the central main mark 211 as integral parts of the mark. The protrusions may not, however, have the same widths.

The left main mark 212 and the right main mark 213 are formed adjacent to opposite sides of the central main mark 211 (S252). The left main mark 212 and the right main mark 213 may be formed by the same sputtering process that forms the central main mark 211, i.e., simultaneously with the central main mark 211. At this time, the protrusions 214, 216 may be formed at the inner opposite-most sides of the left main mark 212 and the right main mark 213, respectively, as integral parts of the marks.

Next, the first sub-mark 220 is formed on the central portion of the central main mark 211 (S254).

Also, the left sub-mark 231 is formed on the region bounded by the left main mark 212, and the right sub-mark 235 is formed on the region bounded by the right main mark 213 (S256). As described previously, the left sub-mark 231 is located adjacent the upper left corner of the left main mark 212, and the right sub-mark 235 is located adjacent the lower right corner of the right main mark 213.

Subsequently, a degree of alignment between the central main mark 211 and the first sub-mark 220 is determined (S258) in substantially the same manner as that described in connection with the degree of alignment between the main mark 110 and the first sub-mark 120 in the first embodiment. This degree of alignment will also be designated as the first degree of alignment.

A degree of alignment between the left main mark 212 and the left sub-mark 231 is also determined (S260). Specifically, a first distance between a first inner (left) side edge of the left main mark 212 and a first outer (left) side edge of the left sub-mark 231 faced towards the first inner side edge of the left main mark 212 is measured. Furthermore, a second distance between a second inner (right) side edge of the left main mark 212 and a second outer (right) side edge of the left sub-mark 231, opposite the first outer side edge of the left sub-mark 231 and faced towards the second inner side edge of the left main mark 212, is measured. The difference between the first and second distances is divided by two, and the resulting value is assigned as the degree of alignment between the left main mark 212 and the left sub-mark 231 (hereinafter designated as the second degree of alignment).

A degree of alignment between the right main mark 213 and the right sub-mark 235 is also determined (S262). Specifically, a first distance between a first inner (right) side edge of the left main mark 213 and a first outer (right) side edge of the left sub-mark 235 faced towards the first inner side edge of the right main mark 213 is measured. Furthermore, a second distance between a second inner (left) side edge of the left main mark 213 and a second outer (left) side edge of the left sub-mark 235, opposite the first outer side edge of the left sub-mark 235 and faced towards the second inner side edge of the left main mark 213, is measured. The difference between the first and second distances is divided by two, and the resulting value is assigned as the degree of alignment between the right main mark 213 and the right sub-mark 235 (hereinafter designated as the third degree of alignment).

Next, the difference between the second degree of alignment and the third degree alignment is divided by two. The resulting value is subtracted from the first degree of alignment to obtain a value representing the actual degree of alignment between the central mark 211 and the first sub-mark 220 (S264).

Figure 8:
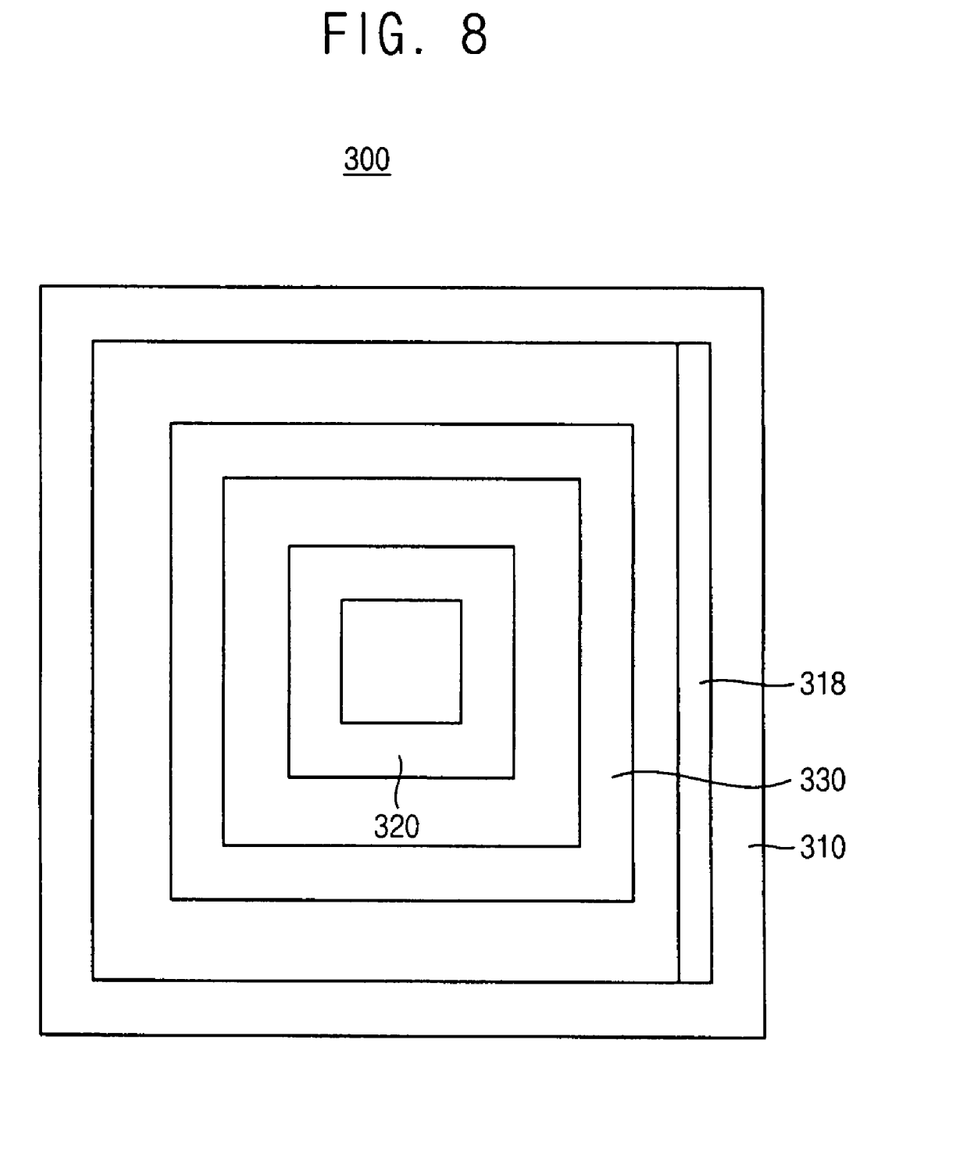
FIG. 8 is a plan view of an example embodiment of an alignment inscription in accordance with the present invention.

FIG. 8 shows another example embodiment of a substrate having alignment marks 300 according to the present invention. Those aspects of this embodiment which are the same as those described above in connection with first embodiment will not be described for the sake of brevity.

Referring to FIG. 8, the alignment marks 300 are formed on a scribe line of a semiconductor substrate and which scribe line demarcates dies of the substrate (refer to FIGS. 3 and 4). The alignment marks 300 include a main outer mark 310, a main inner mark 320 and a sub-mark 330.

The main outer mark 310 is formed on the semiconductor substrate simultaneously with the forming of a lower pattern using a series of processes including a sputtering process. For example, the main outer mark 310 is part of a conductive pattern and has the shape of a rectangular band. Furthermore, the main outer mark 310 may have a protrusion 318 at an inner side thereof, formed as a result of an error in the sputtering process used to form the lower pattern and the main outer mark 310.

The main inner mark 320 is formed inside of the main outer mark 310. In this respect, the main inner mark 320 may be formed simultaneously with the main outer mark 310. Furthermore, the main inner mark 320 has the shape of a rectangular band smaller than that of the main outer mark 310.

The sub-mark 330 is formed on a region between the main outer mark 310 and the main inner mark 320 by a second series of processes for forming an upper pattern on the lower pattern. Therefore, the sub-mark 330 is smaller than the main outer mark 310 and larger than the main inner mark 320.

The sub-mark 330 may be part of the photoresist pattern formed by the second series of processes and preferably, has the shape of a rectangular band. Distances between outer side edges of the sub-mark 330 and inner side edges of the main outer mark 310 facing the outer side edges of the sub-mark 330 are measured and averaged to obtain a first value representing the degree of alignment between the main outer mark 310 and the sub-mark 330. Furthermore, distances between inner side edges of the sub-mark 330 and outer side edges of the main inner mark 320 are measured and averaged to obtain a second value representing the degree of alignment between the main inner mark 320 and the sub-mark 330.

The second degree of alignment is subtracted from the first degree of alignment and the result is used as a value representing the degree of alignment between the main outer mark 310 and the sub-mark 330.

According to the present invention as described above, a value representing an actual degree of alignment between a main mark and a sub-mark is produced even if the main mark is asymmetrical. Thus, the degree of alignment between an upper pattern and a lower pattern formed on a substrate can be accurately determined. As a result, patterns sequentially formed on a semiconductor substrate or the like can be accurately superimposed, i.e., can be aligned with a high degree of precision.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A substrate having a scribe line that demarcates regions dedicated to accommodate circuit structures, and alignment marks inscribed on the scribe line, wherein the alignment marks include:

at least one main mark having a first inner side edge and a second inner side edge faced towards each other;

a first sub-mark disposed on the substrate at a level different from that at which the main mark is disposed, situated intermediate the first and the second inner side edges of the main mark, and having a first outer side edge and a second outer side edge faced in directions towards the first and the second inner side edges of the main mark; and two second sub-marks disposed on the substrate at a level different from that at which the main mark is disposed and disposed symmetrically with respect to the first sub-mark.

2. The substrate of claim 1, wherein the main mark has a first outer side edge and a second outer side edge facing in opposite directions at opposite sides of the first and the second inner side edges thereof, respectively, and each of the second sub-marks has inner side edges located to both sides of a respective pair of the inner and the outer side edges of the main mark.

3. The substrate of claim 2, wherein the main mark is a band in the shape of a rectangle, and the second sub-marks are each a band in the shape of a rectangle, and the second sub-marks extend over first and second sides of the main mark that are disposed opposite each other, respectively.

4. The substrate of claim 3, wherein centers of the rectangles of the second sub-marks are located along a line passing through a point that lies centrally between the first and the second outer side edges of the first sub-mark.

5. The substrate of claim 3, wherein the first sub-mark has a third outer side edge and a fourth outer side edge, and the alignment marks further comprise third sub-marks each being a band in the shape of a rectangle, the third sub-marks extending over third and fourth sides of the main mark that are disposed opposite each other, respectively.

6. The substrate of claim 5, wherein centers of the rectangles of the third sub-marks are located along a line that passes through a point that lies centrally between the third and the fourth outer side edges of the first sub-mark.

7. The substrate of claim 1, wherein the at least one main mark has two corners disposed diagonally opposite each other, and wherein the second sub-marks are disposed adjacent the two corners, respectively, so as to lie directly over a diagonal line passing through the corners, and the second sub-marks have outer side edges faced in directions towards inner side edges of the at least one main mark.

8. The substrate of claim 7, wherein the at least one main mark comprises a central main mark having inner side edges facing each other and in between which the first sub-mark is situated, and peripheral main marks disposed to both sides of the central mark, each of the peripheral main marks having inner side edges facing each other in the same direction as the inner side edges of the central mark, and each of the second sub-marks being situated in between the inner side edges of a respective one of the peripheral marks.

9. The substrate of claim 1, wherein the main mark constitutes a conductive pattern, and the first sub-mark constitutes a photoresist pattern.

10. The substrate of claim 1, wherein the two second sub-marks are situated on the substrate above the level of the main mark.

11. The substrate of claim 1, wherein the main mark constitutes a conductive pattern, and the first sub-mark and the second sub-marks constitute photoresist patterns.

12. A substrate having a scribe line that demarcates regions dedicated to accommodate circuit structures, and alignment marks inscribed on the scribe line, wherein the alignment marks include:
   a main outer mark having a first inner side edge and a second inner side edge faced towards each other;
   a main inner mark disposed at the same level as the main mark and situated in between the inner side edges of the main outer mark, the main inner mark having a first outer side edge and a second outer side edge faced towards the first and the second inner side edges of the main outer mark, respectively; and
   a sub-mark disposed on the substrate at a level different from those at which the main inner and outer marks are disposed, and situated intermediate the main outer and inner marks, the sub-mark having outer side edges faced in directions towards the inner side edges of the main outer mark, respectively, and inner side edges faced in directions towards the outer side edges of the main inner mark, respectively.

13. The substrate of claim 12, wherein the main outer mark, the main inner mark and the sub-mark are each a band in the form of a rectangle.

* * * * *